(12) United States Patent
Takagi et al.

(10) Patent No.: US 6,873,520 B2
(45) Date of Patent: Mar. 29, 2005

(54) PORTABLE APPARATUS

(75) Inventors: Hisamitsu Takagi, Kawasaki (JP); Shigeru Yamaguchi, Inagi (JP)

(73) Assignees: Fujitsu Limited, Kawasaki (JP); Fujitsu Frontech Limited, Tokyo (JP)

( * ) Notice: Subject to any disclaimer, the term of this patent is extended or adjusted under 35 U.S.C. 154(b) by 0 days.

(21) Appl. No.: 10/761,244

(22) Filed: Jan. 22, 2004

(65) Prior Publication Data

US 2004/0160748 A1 Aug. 19, 2004

Related U.S. Application Data

(63) Continuation of application No. PCT/JP02/07815, filed on Jul. 31, 2002.

(30) Foreign Application Priority Data

Jul. 31, 2001 (JP) .......................................... 2001-232626

(51) Int. Cl.[7] ............................................... G06F 1/16
(52) U.S. Cl. ......................... 361/679; 361/680; 361/681
(58) Field of Search .................................. 361/679–681

(56) References Cited

U.S. PATENT DOCUMENTS

| | | | |
|---|---|---|---|
| 5,103,377 A | * | 4/1992 | Kobayashi et al. ......... 361/681 |
| 5,141,446 A | | 8/1992 | Ozouf et al. |
| 5,381,440 A | | 1/1995 | Schubert |
| 5,394,297 A | * | 2/1995 | Toedter ...................... 361/683 |
| 5,681,176 A | * | 10/1997 | Ibaraki et al. ............... 439/165 |
| 6,754,507 B2 | * | 6/2004 | Takagi ..................... 455/550.1 |

FOREIGN PATENT DOCUMENTS

| | | |
|---|---|---|
| JP | 5-19896 | 1/1993 |
| JP | 6-295212 | 10/1994 |
| JP | 6-310874 | 11/1994 |
| JP | 6-311216 | 11/1994 |
| JP | 9-82439 | 3/1997 |
| JP | 10-49256 | 2/1998 |
| JP | 11-41328 | 2/1999 |
| JP | 11-163986 | 6/1999 |
| JP | 11-307962 | 11/1999 |
| JP | 2000-216567 | 8/2000 |
| WO | WO 03/013205 | 2/2003 |

* cited by examiner

*Primary Examiner*—Yean-Hsi Chang
(74) *Attorney, Agent, or Firm*—Staas & Halsey LLP

(57) ABSTRACT

The present invention relates to a portable apparatus such as a mobile phone or a notebook type personal computer, an object of which is to improve the durability of a flexible flat cable without lowering the degree of freedom of a curled portion thereof and prevent the same from being locally worn. This portable apparatus includes a first housing having a printed board module, a second housing coupled at one end thereof with the first housing via a hinge mechanism and having a printed board module, a flexible flat cable connected at one end thereof with the printed board module in the first housing and at the other end thereof with the printed board module in the second housing, while being at least once curled at a position corresponding to the hinge mechanism, and an insert member to be inserted into the curled portion of the flexible flat cable. This insert member is not fixed to either the first housing or the second housing but the movement thereof is restricted.

7 Claims, 16 Drawing Sheets

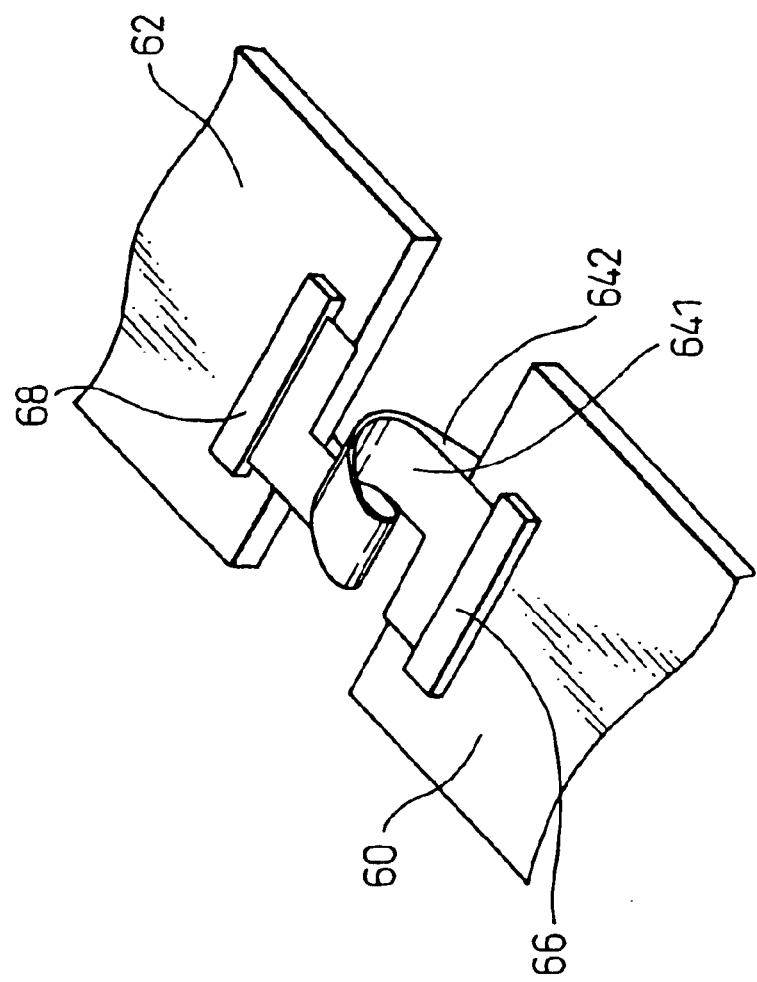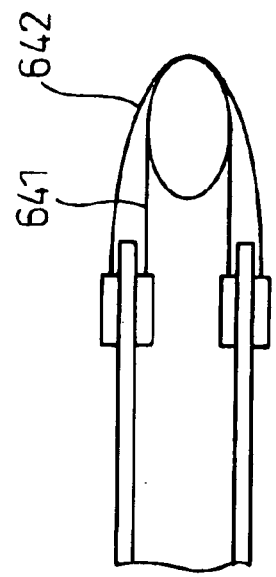

PORTABLE APPARATUS

CROSS-REFERENCE TO RELATED APPLICATIONS

This application is a continuation of PCT/JP02/07815, filed on Jul. 31, 2002, the contents being incorporated therein by reference.

TECHNICAL FIELD

The present invention relates to a portable apparatus, particularly, a folding type mobile phone or a notebook type personal computer.

BACKGROUND ART

A folding type mobile phone includes a first housing having a printed board module (for example, a stationary housing) and a second housing coupled to the first housing via a hinge and having a printed board module (for example, a movable housing). The movable housing can be opened and closed relative to the stationary housing held by a hand. A notebook type personal computer is also of substantially the same structure as described above; that is, includes a stationary housing, a movable housing and a hinge mechanism for coupling the both.

In the portable apparatus of such a structure, it is necessary to electrically connect the printed board module accommodated in the stationary housing with that accommodated in the movable housing. For this purpose, flexible flat cables have been widely used, which have a good follow-up ability, flexibility and durability against the opening/closing motions repeated by the hinge. While the flexible flat cable is connected at one end, for example, to the printed board module on the stationary housing side and at the other end to the printed board module on the movable housing side, the flexible flat cable is liable to be damaged by repeated stresses applied to a position thereof corresponding to the hinge portion due to the repetition of the opening/closing motion of the movable housing relative to the stationary housing.

To solve such a problem, there is one proposal for example, in Japanese Unexamined Patent Publication (Kokai) No. 6-311216, in which the flexible flat cable used for a folding type mobile phone is curled in a portion corresponding to the hinge so that the displacement accompanied with the opening/closing motion of the movable housing relative to the stationary housing is absorbed thereby. Also, Japanese Unexamined Patent Publication (Kokai) No. 5-19896 discloses a portable type information processing device in which a root portion of a cable is rounded to be capable of being drawn in a predetermined direction. The flexible flat cable having such a curled portion is adapted to absorb a stress applied onto the flexible flat cable due to the opening/closing motion of the movable housing relative to the stationary housing into the curled portion so that the motion is stabilized. In this structure, however, there are problems in that a curvature of the curled portion becomes partially smaller during the repetition of the opening/closing motion, whereby the stress is concentrated to this part, or the curled portion may be in contact with other members due to the deformation thereof.

To solve such problems, Japanese Unexamined Patent Publication (Kokai) No. 11-163986 proposes a folding type mobile phone in which holders for holding a hinge pin are provided on opposite sides of one housing, and when the hinge pin of a hinge pin unit passes through both the hinge pin holders, the hinge pin is inserted into a loop section of a flexible printed circuit board. According to this structure, since the hinge pin is inserted into the loop, a curvature of the loop section is prevented from being smaller than a predetermined value due to this hinge pin.

As described in Japanese Unexamined Patent Publication (Kokai) No. 11-163986, it is possible to inhibit the curvature of the loop section from being smaller than the predetermined value by inserting the hinge pin into the loop section. According to this structure, however, since the hinge pin is fixed to the hinge pin unit, a spontaneous motion of the curled section in the flexible flat cable is disturbed or part of the flexible flat cable is rubbed with the hinge pin and partially worn.

DISCLOSURE OF THE INVENTION

An object of the present invention is to provide a portable apparatus capable of absorbing a stress caused by the repeated opening/closing motions of a movable housing relative to a stationary housing by a curled portion of a flexible flat cable and securing a spontaneous motion of the curled portion, whereby the durability of the curled portion is facilitated without suppressing a degree of freedom of the motion thereof. Another object of the present invention is to provide a portable apparatus capable of preventing part of the flexible flat cable from locally wearing by being rubbed with the hinge pin.

According to the present invention, to achieve the above-mentioned objects, a portable apparatus is provided, comprising a first housing having a printed board module, a second housing coupled at one end thereof with the first housing via a hinge mechanism and having a printed board module, a flexible flat cable connected at one end thereof with the printed board module in the first housing and at the other end thereof with the printed board module in the second housing, while being once curled at a position corresponding to the hinge mechanism, and an insert or pin member to be inserted into the curled portion of the flexible flat cable, wherein the insert member is not fixed to either the first housing or the second housing but provided with a mechanism for limiting the movement of the insert member.

As described above, since the insert member is inserted into the curled portion of the flexible flat cable in the present invention, a curvature of the flexible flat cable does not locally become extremely small even though the opening/closing motion of the movable housing relative to the stationary housing is frequently repeated. Also, there is no portion in the flexible flat cable, to which a stress is locally concentrated. Thereby, the durability of the flexible flat cable is enhanced. In this regard, the flexible flat cable, of course, includes a flexible printed circuit board in this text.

The mechanism for limiting the movement of the pin member may be a stopper provided in either one of the first and second housings, for mainly inhibiting the inclination of the insert member.

The flexible flat cable may be provided with double-layered circuit patterns, one of which is connected to one surface of the respective printed board module and the other is connected to another surface of the respective printed board module.

The pin member may be made of elastic material such as sponge.

BRIEF DESCRIPTION OF THE DRAWINGS

FIGS. 15(a) and 15(b) are a perspective view and a sectional view, respectively, illustrating a flexible printed board having double-layered circuit patterns;

BEST MODE FOR CARRYING OUT THE INVENTION

The present invention will be described below in more detail based on the preferred embodiments of the present invention with reference to the attached drawings.

Figure 1:
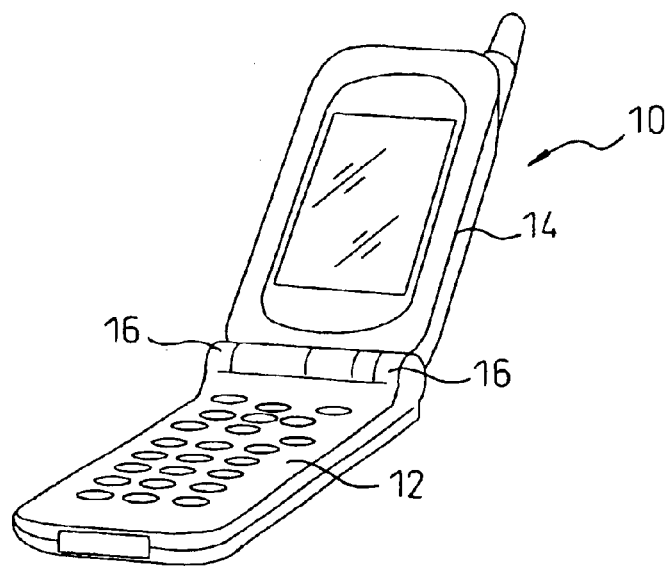
FIG. 1 is a perspective view of a mobile phone according to a first embodiment of the inventive portable apparatus.

FIG. 1 is a perspective view of a mobile phone 10 according to one embodiment of the present invention. The mobile phone 10 includes a stationary housing 12 and a movable housing 14 coupled to the stationary housing 14 by a hinge mechanism 16. 16 in an openable/closable manner.

Figure 2:
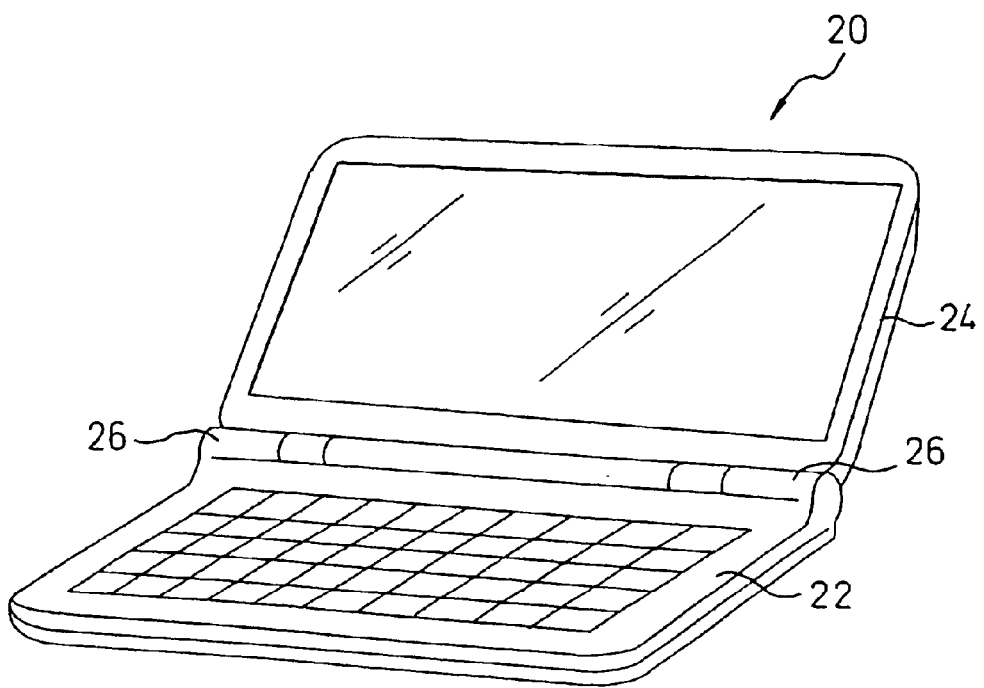
FIG. 2 is a perspective view of a notebook type personal computer according to another embodiment of the inventive portable apparatus.

FIG. 2 is a notebook type personal computer 20 according to another embodiment of the present invention. The notebook type personal computer 20 includes a stationary housing 22 and a movable housing 24 coupled to the stationary housing 22 by a hinge mechanism 26. 26 in an openable/closable manner.

While the mobile phone 10 shown in FIG. 1 and the notebook type personal computer 20 shown in FIG. 2 are examples of the inventive portable apparatus, the present invention should not be limited to the illustrated ones. The present invention is applicable to all portable apparatus having a hinge mechanism and adapted so that the electric connection is made between one side and the other side thereof via a flexible flat cable. The present invention will be described below with reference to a mobile phone as one example.

Figure 3:
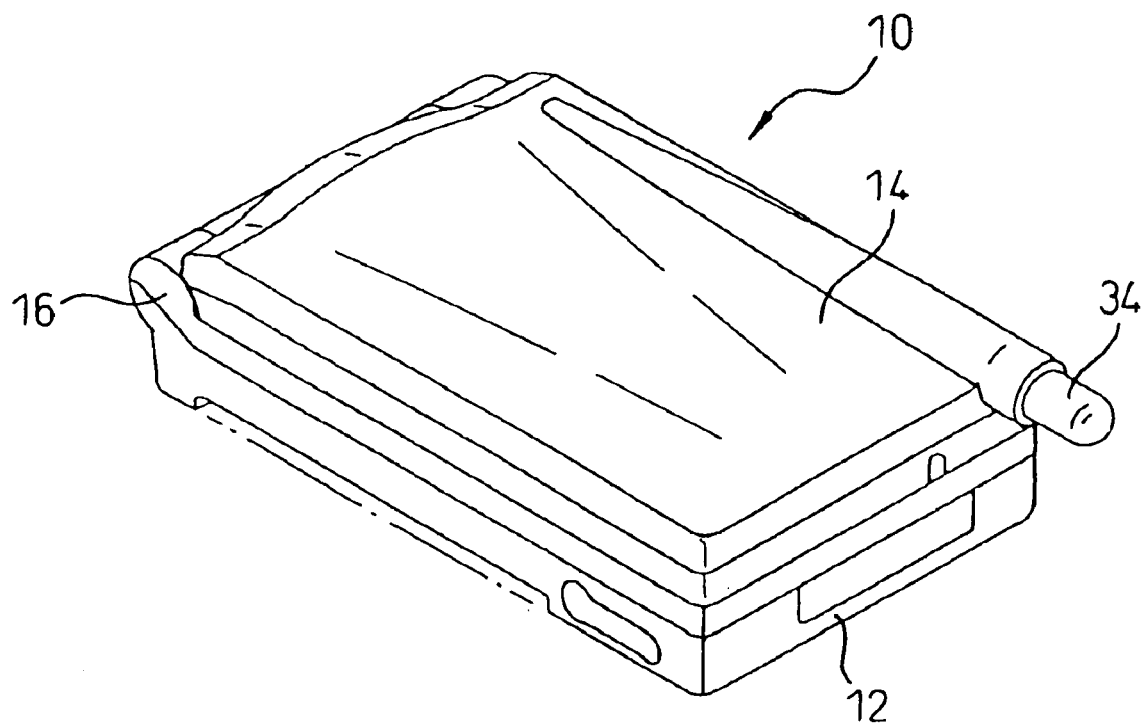
FIGS. 3 and 4 are perspective views of the mobile phone in which a movable housing is closed and opened, respectively, relative to a stationary housing.

FIG. 3 is a perspective view illustrating the mobile phone 10 in which the movable housing 14 is closed relative to the stationary housing 12. When the movable housing 14 is closed relative to the stationary housing 12, both the housings are biased by biasing means not shown so that an angle made between them is set at 0 degree.

Figure 4:
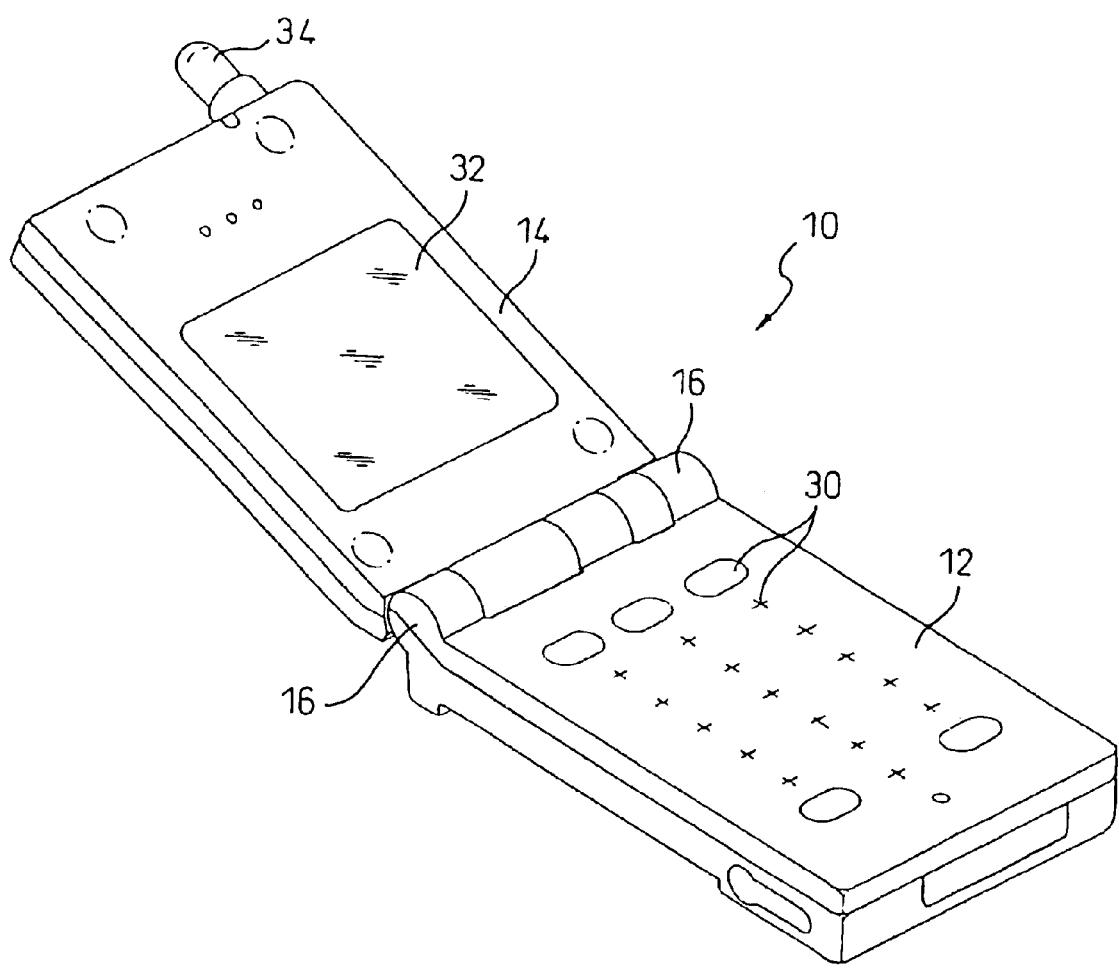

FIG. 4 is a perspective view illustrating the mobile phone 10 in which the movable housing 14 is opened relative to the stationary housing 12. When the movable housing 14 is opened relative to the stationary housing 12, both the housings are biased by biasing means not shown so that an angle made between them is set at 160 degrees.

Figure 7:
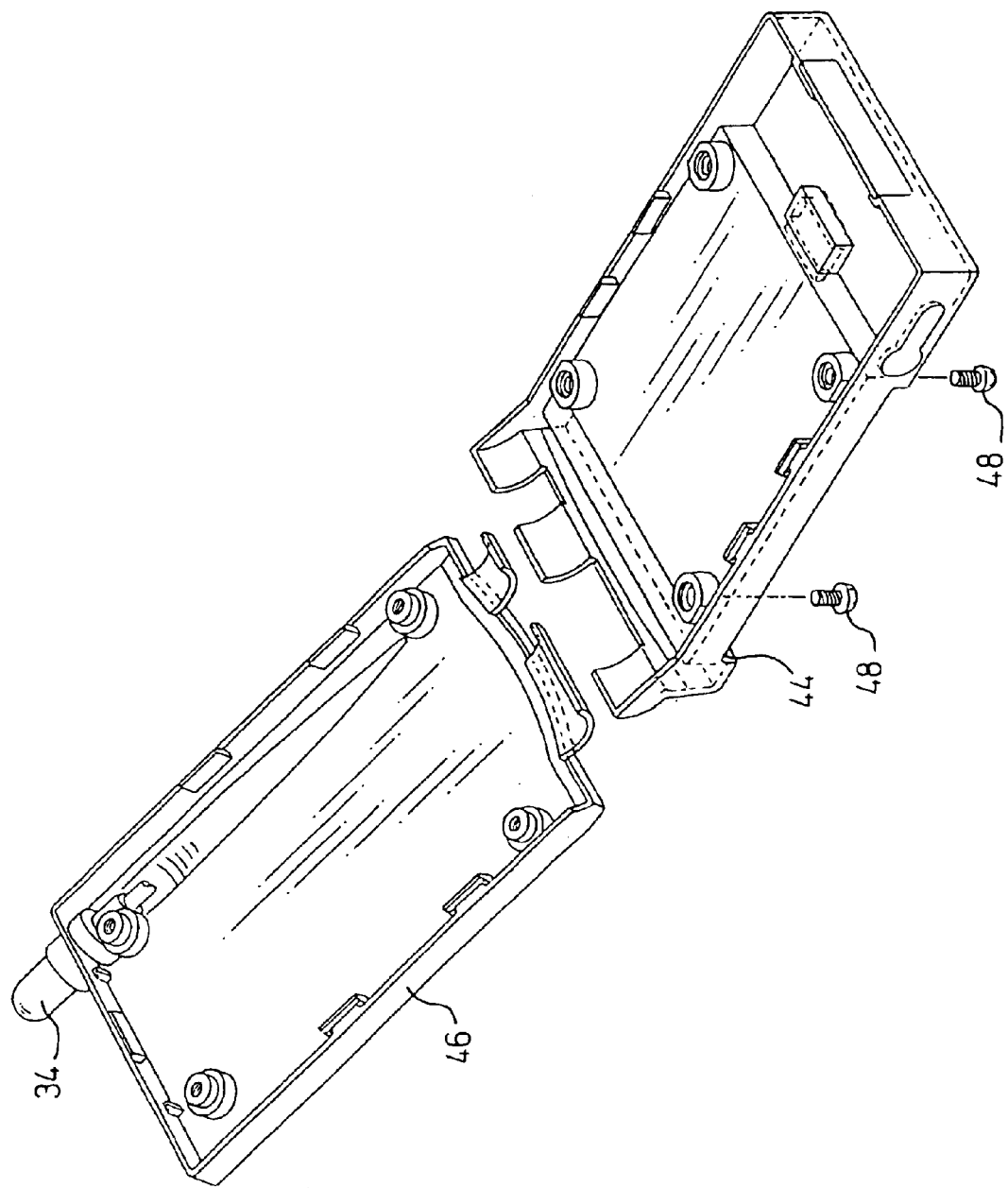
FIG. 7 is a perspective view illustrating a stationary rear case and a movable rear case disposed on lower sides of the stationary chassis and the movable chassis, respectively.

In FIGS. 3 and 4, the stationary housing 12 has a plurality of bush keys 30, and the movable housing 14 has a display 32 and an antenna 34. These members are also shown in FIGS. 5 and 7.

Figure 5:
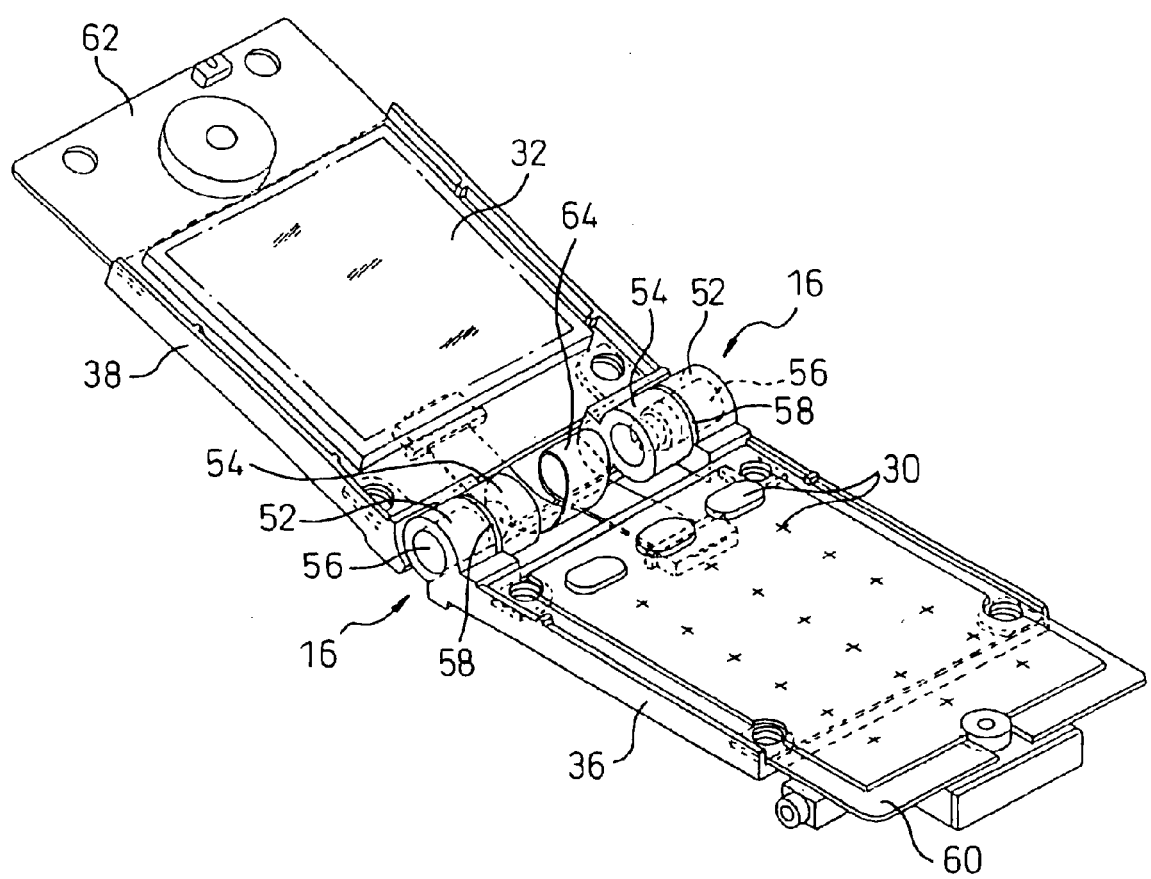
FIG. 5 is a perspective view of the mobile phone illustrating a stationary chassis and a movable chassis which are main parts of the stationary and movable housings, respectively.
Figure 6:
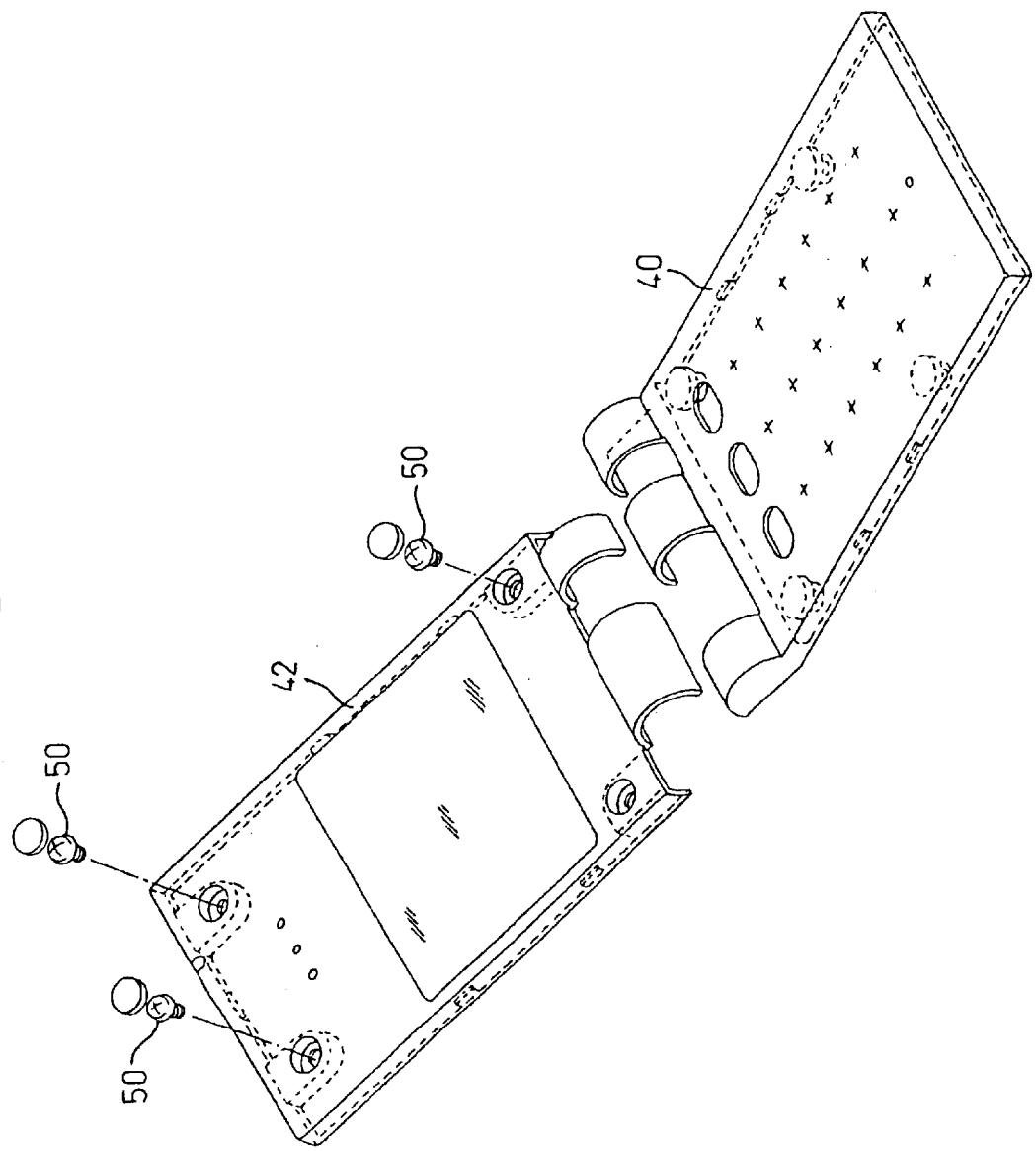
FIG. 6 is a perspective view illustrating a stationary front case and a movable front case disposed on upper sides of the stationary chassis and the movable chassis, respectively.

FIG. 5 is a perspective view illustrating a stationary chassis 36 and a movable chassis 38 which are main parts of the stationary housing 12 and the movable housing 14, respectively, of the mobile phone 10. FIG. 6 is a perspective view illustrating a stationary front case 40 and a movable front case 42 disposed on upper sides of the stationary chassis 36 and the movable chassis 38 shown in FIG. 5, respectively. FIG. 7 is a perspective view illustrating a stationary rear case 44 and a movable rear case 46 disposed on lower sides of the stationary chassis 36 and the movable chassis 38 shown in FIG. 5, respectively. The stationary front case 40, the stationary chassis 36 and the stationary rear case 44 are fixed together by means of screws 50.

In FIG. 5, the movable chassis 38 is coupled to the stationary chassis 36 by means of the hinge mechanism 16. There are a pair of left and right hinge mechanisms 16 provided on the same axis, each of which includes a first hinge bearing 52 disposed in the stationary chassis 36, a second hinge bearing 54 disposed in the movable chassis 38, and hinge pins 56 inserted into the first hinge bearing 52 and the second hinge bearing 54, respectively. The hinge pins 56 are fit into holes provided in the first hinge bearing 52 and the second hinge bearing 54, respectively, so that the movable chassis 38 is rotatable relative to the stationary chassis 36.

The stationary chassis 36 is made of magnesium to be integral with the pair of left and right first hinge bearings 52. Similarly, the movable chassis 38 is made of magnesium to be integral with the pair of left and right second hinge bearings 52. In each of the two hinge mechanisms 16, at least one washer 58 formed to have a deformable shape is inserted between a side surface of the first hinge bearing 52 and a side surface of the second hinge bearing 54.

Since the first hinge bearing 52 and the second hinge bearing 54 are relatively rotated, if there is no washer 58, the side surfaces of the first and second hinge bearings 52 and 54 are not brought into tight contact with each other to result in the unfavorable electric connection between the stationary chassis 36 and the movable chassis 38. In the present invention, since one surface of the washer 58 is assuredly in contact with the side surface of the first hinge bearing 52 and the other surface of the washer 58 is assuredly in contact with the side surface of the second hinge bearing 54 by inserting the washer 58 formed to have the deformabte shape (a non-flat shape or a shape having a curved surface) between both the hinge bearings, it is possible to improve the electric connection between the stationary chassis 36 and the movable chassis 38 and thus form a favorable earth, or ground.

A printed board 60 is mounted to the stationary chassis 36, and a printed board 62 is mounted to the movable chassis 38. A printed board 64 passes between the two hinge mechanisms 16 and is connected via connectors to the printed board 60 and 62, respectively. The stationary front case 40, the movable front case 42, the stationary rear case 44 and the movable rear case 46 have cover parts for covering the hinge mechanisms 16 and the flexible printed board 64.

Figure 8:
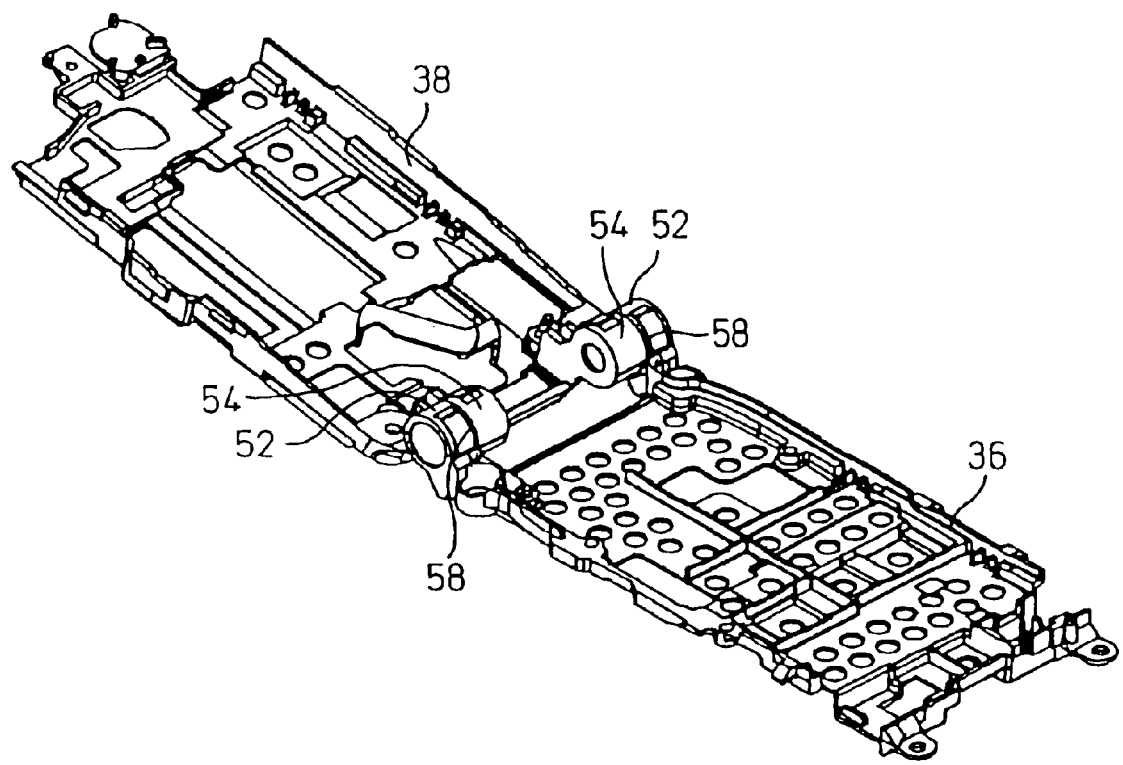
FIG. 8 is a perspective view illustrating the stationary and movable chassis, respectively, from which are removed printed boards shown in FIG. 5.
Figure 9:
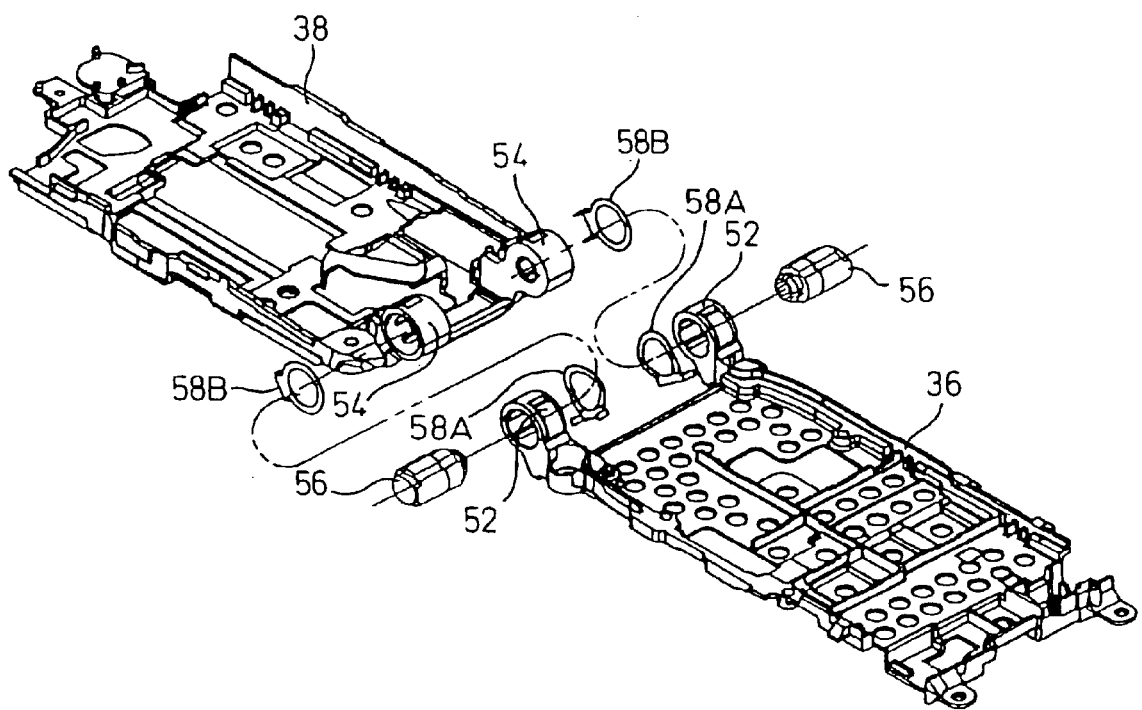
FIG. 9 is an exploded perspective view illustrating the stationary chassis and the movable chassis shown in FIG. 8.

FIG. 8 is a perspective view illustrating the stationary chassis 36 and the movable chassis 38 shown in FIG. 5, from which are removed the printed boards. FIG. 9 is an exploded perspective view illustrating the stationary chassis 36 and the movable chassis 38 prior to being coupled together. In FIG. 5, the at least one washer 58 is shown as that formed to have an elastically deformable shape. In FIG. 9, however, the at least one washer 58 is shown as two washers 58A and 58B.

Even by a single washer 58, it is possible to improve the electric connection between the stationary chassis 36 and the movable chassis 38 as described before. In a case of the single washer 58, however, the slide occurs between the washer 58 and the side surface of the first hinge bearing 52 and between the washer 58 and the side surface of the second hinge bearing 54, due to the relative rotation between the first and second hinge bearings 52 and 54, whereby the first hinge bearing 52 and the second hinge bearing 54 made of magnesium are liable to wear while the mobile phone has been used for a long period.

To solve this problem, as shown in FIGS. 8 and 9, two washers 58A and 58B are disposed between the side surface of the first hinge bearing 52 and the side surface of the second hinge bearing 54 so that one washer 58A is held not to rotate relative to the first hinge bearing 52 and the other washer 58B is held not to rotate relative to the second hinge bearing 54. According to this structure, it is possible to eliminate the slide between the washer 58A and the side surface of the first hinge bearing 52 and between the washer 58B and the side surface of the second hinge bearing 54, and thus to prevent the first hinge bearings 52 and 54 made of magnesium from wearing. While the two washers 58A and 58B are slid to each other, there is no problem because they are made of wear-resistant metal such as spring steel.

It is possible to maintain the favorable electric contact between the two washers for a long period by selecting a flat type as the one washer 58A and a spring type as the other 58B.

Figure 10:
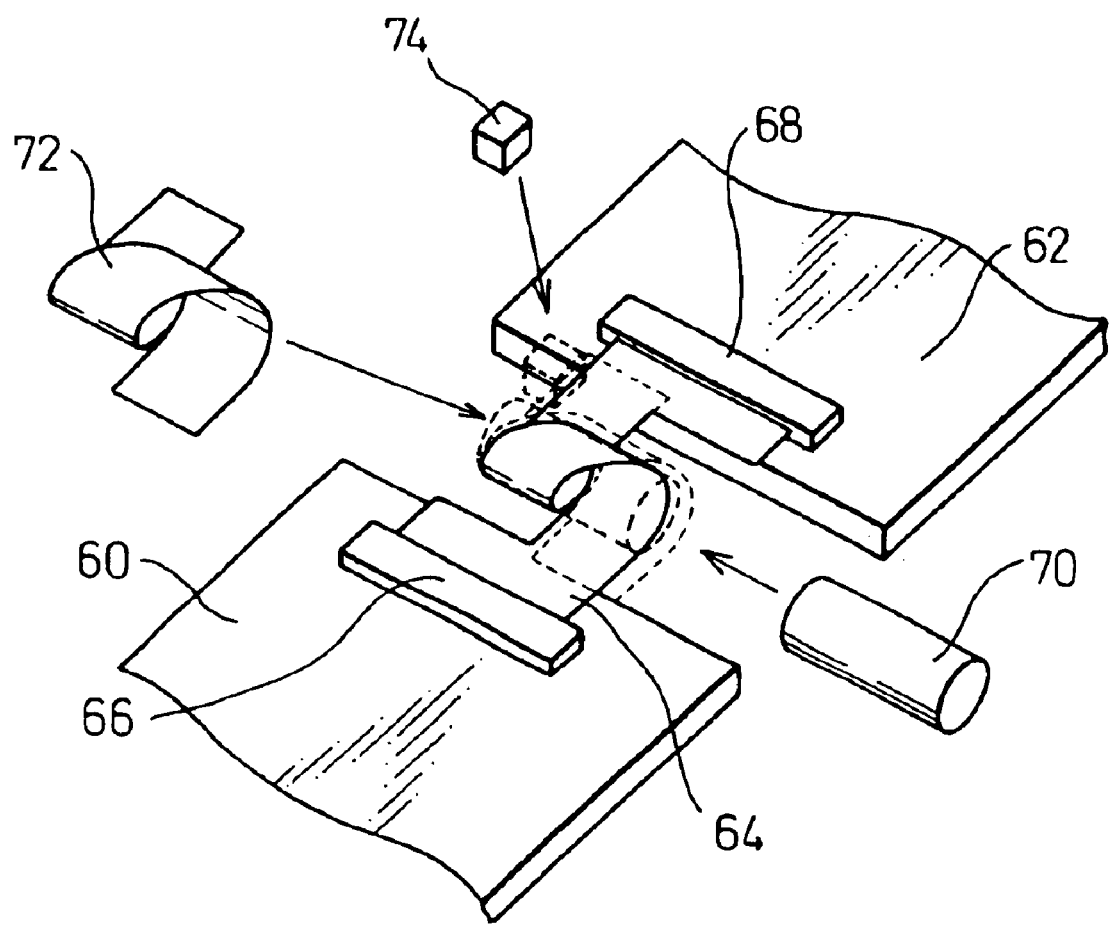
FIG. 10 is a perspective view illustrating a curled portion of a flexible printed board for electrically connecting the printed boards with each other.
Figure 11A:
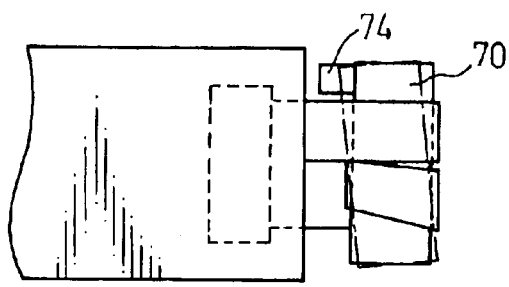
FIGS. 11(a) and 11(b) are a schematic plan view and a schematic sectional view, respectively, illustrating the curled portion of the flexible printed board in a closed state of the movable housing relative to the stationary housing.
Figure 11B:
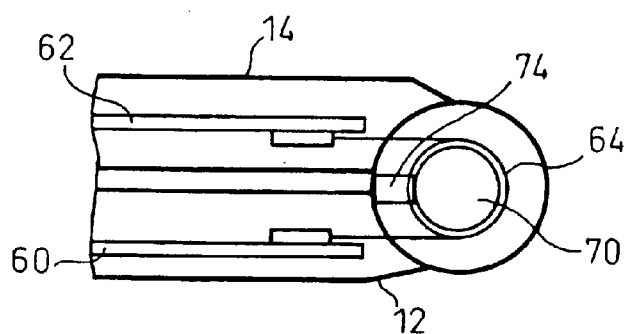

FIG. 10 is a perspective view illustrating a curled portion of a flexible printed board for connecting the printed boards to each other. FIGS. 11(*a*) and 11(*b*) are a schematic plan view and a schematic sectional view, respectively, of the curled portion of the flexible printed board when the movable housing is closed relative to the stationary housing.

Figure 12A:
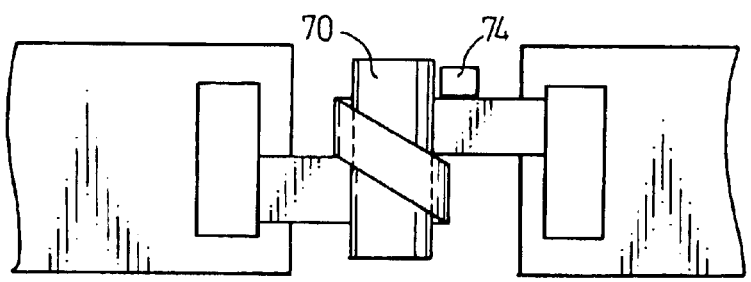
FIGS. 12(a) and 12(b) are a schematic plan view and a schematic sectional view, respectively, illustrating the curled portion of the flexible printed board in an opened state of the movable housing relative to the stationary housing.
Figure 12B:
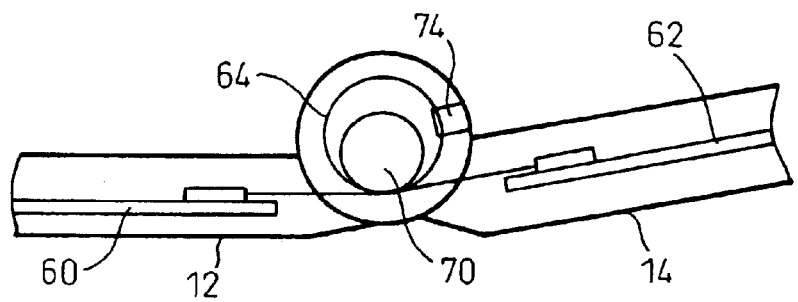

FIGS. 12(*a*) and 12(*b*) are a schematic plan view and a schematic sectional view, respectively, of the curled portion of the flexible printed board when the movable housing is opened relative to the stationary housing.

Figure 13A:
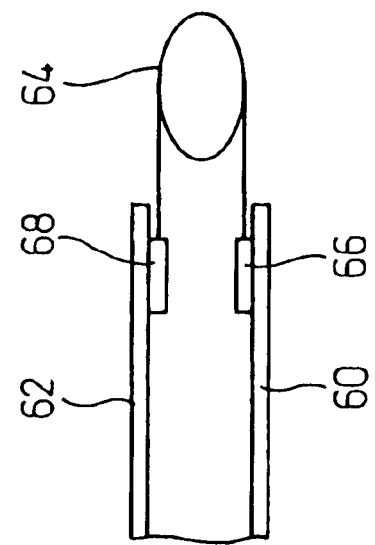
FIGS. 13(a) and 13(b) are a perspective view and a sectional view, respectively, illustrating a curled portion of a conventional flexible printed board.
Figure 13B:
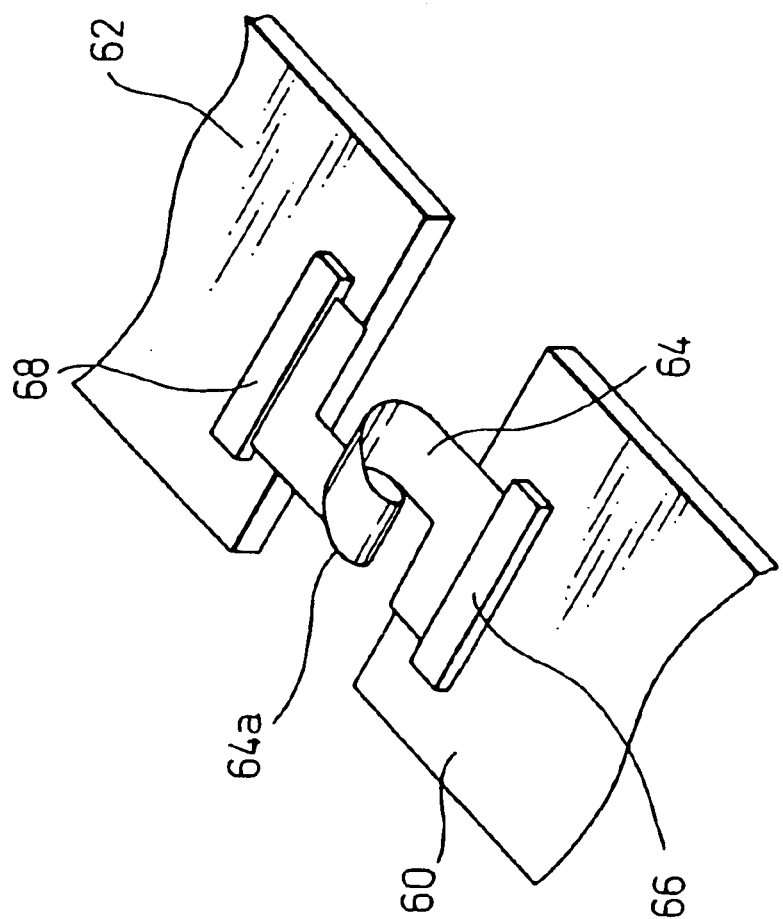

On the contrary, FIGS. 13(*a*) and 13(*b*) are a perspective view and a sectional view, respectively, of the curled portion of the flexible flat cable (flexible printed board) in the prior art. According to this prior art, as illustrated, at one end of the flexible printed board 54, there is a connector 66 connected to the one printed board 60, and at the other end of the flexible printed board 54, there is a connector 68 connected to the other printed board 62. The flexible printed board 64 has at least one curled portion 64*a* wound in a spiral form at a position corresponding to a pivot pin disposed between the stationary and movable housings.

In the prior art, however, there is no means for restricting the curvature of the curled portion 64*a* of the flexible printed board 64. This is problematic in that the curled portion 64*a* may deform to reduce its radius of curvature by the opening/ closing motions repeated for a long period as described before, causing the stress to be locally concentrated.

In the embodiment of the present invention, a pin member 70 is inserted into the curled portion 64*a* of the flexible printed board 64 in the axial direction so that the curled portion 64*a* is not deformed to an extent in which a radius of the curvature thereof is prevented from being smaller than a constant value; i.e., a radius of the pin member 70; even if the opening/closing motion is repeated for a long period. Thus, no part is generated in the curled portion 64*a* of the flexible printed board 64 to which the stress is locally concentrated.

Further, according to this embodiment of the present invention, a protective sheet 72 is arranged along the outer circumference of the curled portion 64*a* of the flexible printed board 64 to particularly protect the flexible printed board 70 from being damaged. Further, a stopper or a pin-pressing member 74 is provided for restricting the movement of the pin member 70 inserted into the curled portion 64*a* of the flexible printed board 64 to maintain the pin member 70 at a normal position. Thereby, the pin member 70 is maintained at the normal position to stabilize the shape of the flexible printed board 64. This stopper 74 is made of elastic material such as rubber or sponge and fixed to the chassis or the like.

Figure 14:
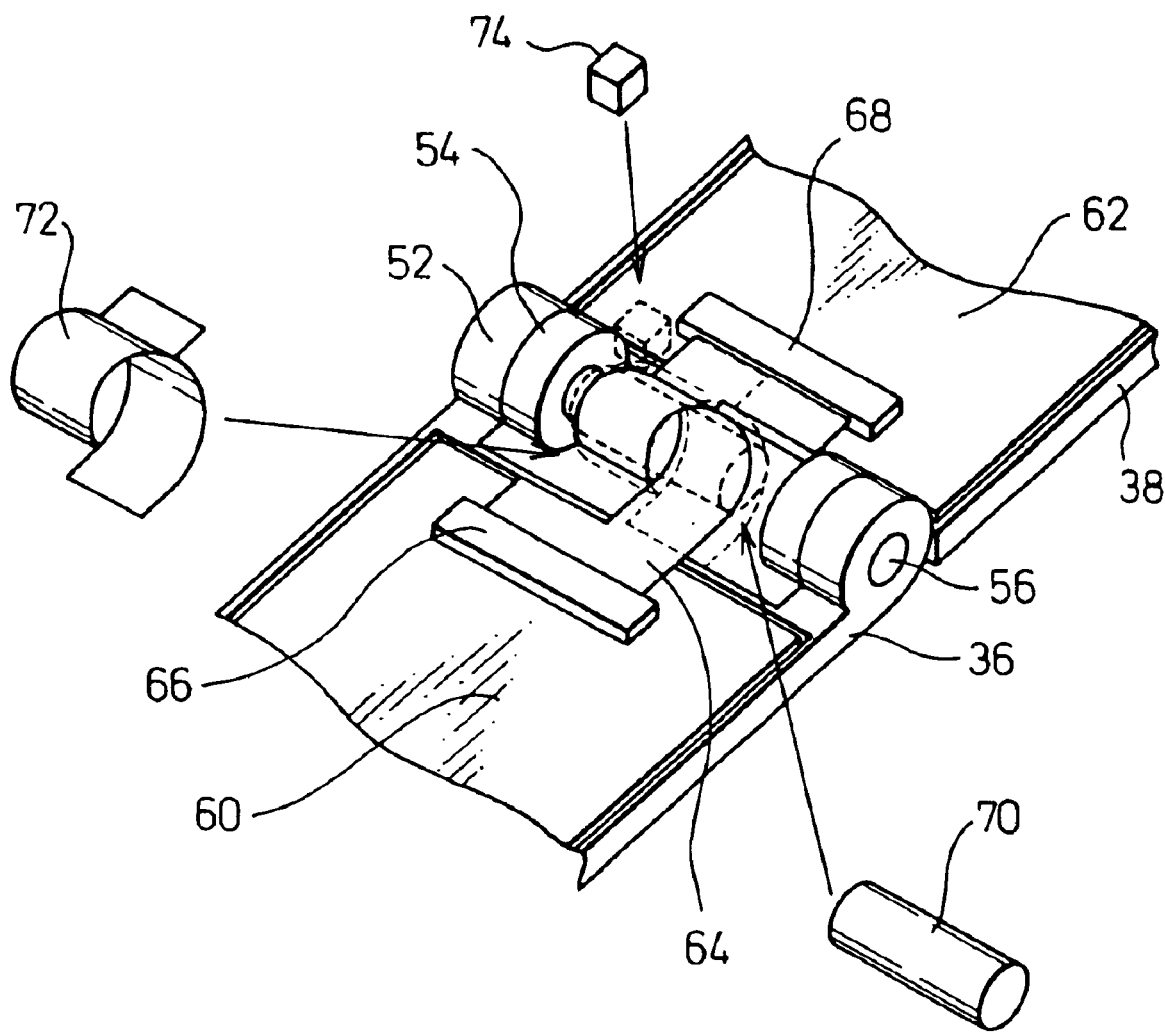
FIG. 14 is a perspective view illustrating a curled portion of a flexible printed board according to the present invention.

FIG. 14 is a perspective view showing the curled portion of the flexible printed board according to the present invention, in which two printed boards 60 and 62 are mounted to the stationary chassis 36 and the movable chassis 38, respectively. The curled portion 64*a* of the flexible printed board 64 is located in a space between a pair of left and right hinge bearings 52, 54. While the pin member 70 is merely inserted into the curled portion of the flexible printed board 64, the axial-directional position thereof is restricted between the pair of hinge pins 56 when the two printed boards 60, 62 are attached to the stationary chassis 36 and the movable chassis 38, respectively and the hinge pin 56 is inserted into the left and right hinge bearings 52, 54 to couple the stationary chassis 36 and the movable chassis 38 with each other, whereby the pin member 70 is prevented from coming out of the curled portion 64*a* of the flexible printed board 64.

The protective sheet 72 is disposed on the outer circumference of the flexible printed board 64 so that opposite ends thereof are fixed to the printed boards 60, 62 at positions in the vicinity of the connectors 66, 68.

FIGS. 15(*a*) and 15(*b*) are a perspective view and a sectional view, respectively, illustrating a curled portion of flexible printed boards 641, 642 combined to have double-layered circuit patterns. Opposite ends of the respective flexible printed boards 641m 642 are connected, respectively, to a front surface and a rear surface of the printed boards 60, 62 via connectors 66, 68 (each showing one surface only). The double-layered flexible printed boards 641 and 642 may be formed by combining two independent, flexible printed boards or, as described later, may be a single flexible printed board in which double-layered circuit patterns are integrated therewith.

In the embodiment shown in FIGS. 15(a) and 15(b), in which no pin member is illustrated, the combination of the flexible printed boards 641, 642 layered to have the double-layered circuit patterns is curled at least once in a spiral manner. Although not illustrated, a protective sheet may be provided to cover the outer circumference of the curled portion.

Figure 16:
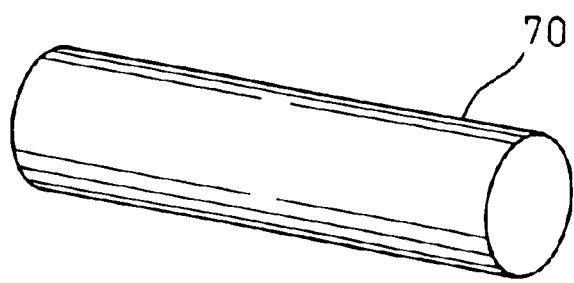
FIGS. 16 and 17 illustrate examples of a pin member, respectively, to be inserted into the curled portion of the flexible printed board.

FIG. 16 shows a cylindrical pin member 70 to be inserted into the curled portion 64a of the flexible printed board 64. The pin member 70 may be made of elastic material such as sponge. For example, chloroprene sponge having a hardness approximately in a range from 20 to 50 degrees is suitable for this purpose. Of course, other rubber-like material may be used, provided it has a hardness equivalent thereto.

Figure 17:
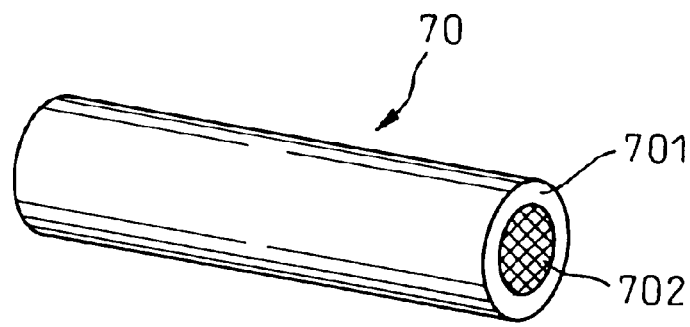

FIG. 17 illustrates another example of a pin member 70, in which a surface 701 thereof is made of sponge or rubber having a hardness approximately in a range from 20 to 50 degrees and a core 702 thereof is made of plastic such as ABS. This pin member 70 is adapted to have a high stiffness in the axial direction while being soft in the surface to smoothly conform with the motion of flexible printed board 64 so that a predetermined curvature is maintained.

Figure 18:
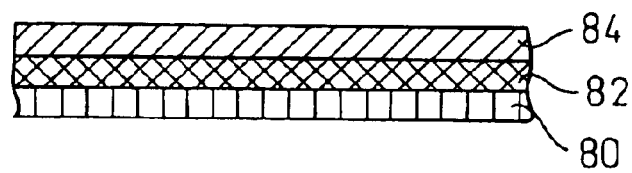
FIG. 18 is a sectional view of the flexible printed board.

FIG. 18 is a sectional view of the flexible printed board 64 of a single-layer type. As is wellknown, the flexible printed board itself consists of a base film 80, on which a copper circuit pattern 82 is formed, and a cover film 84 covering the upper surface thereof for maintaining the insulation. When being connected to both surfaces of the printed boards 60, 62, two printed boards of such a type are used.

Figure 19:
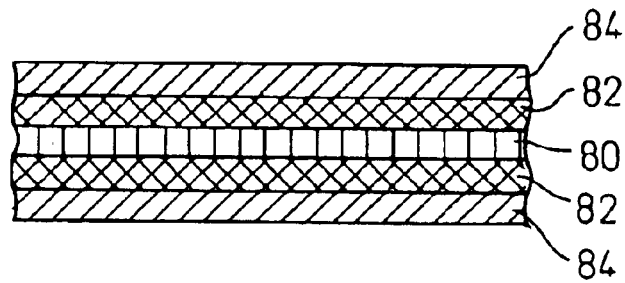
FIG. 19 is a sectional view of the flexible printed board having the double-layered circuit patterns.

FIG. 19 is a sectional view of the flexible printed board having the double-layered circuit patterns. As is wellknown, the flexible printed board of such a type has copper circuit patterns 82, 82 formed on opposite surfaces of a base film 80 and cover films 84, 84 formed on the upper surfaces thereof. Opposite ends of one circuit pattern 82 are connected to one surfaces of the printed boards 60, 62, respectively, via a connector, while opposite ends of the other circuit pattern 82 are connected to the other surfaces of the printed boards 60, 62, respectively, via a connector.

Figure 20:
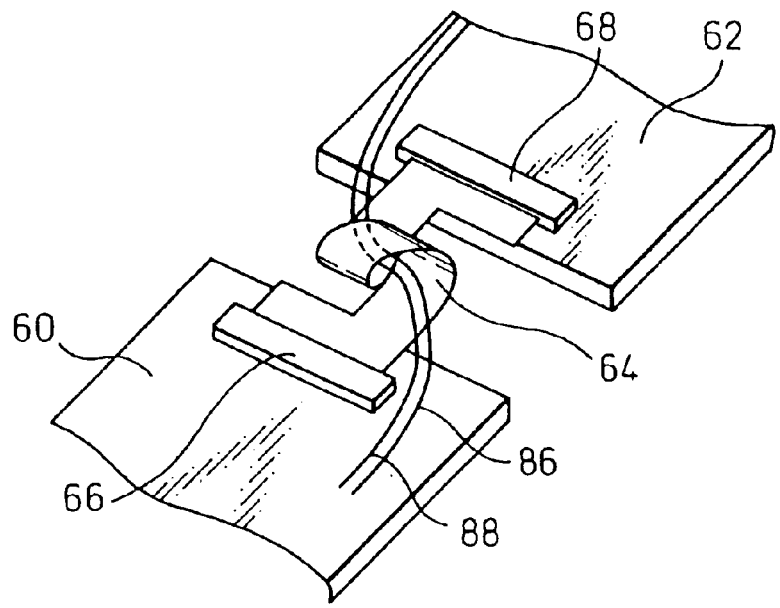
FIG. 20 illustrates the wiring of a coaxial cable in the prior art.

FIG. 20 illustrates the wiring of coaxial cables 86, 88 in the prior art. Since no pin member is inserted into a curled portion of a film type printed board 64, the coaxial cables 86, 88 used for the connection between both printed boards 60, 62 passes through the curled portion of the film type printed board 64.

Figure 21:
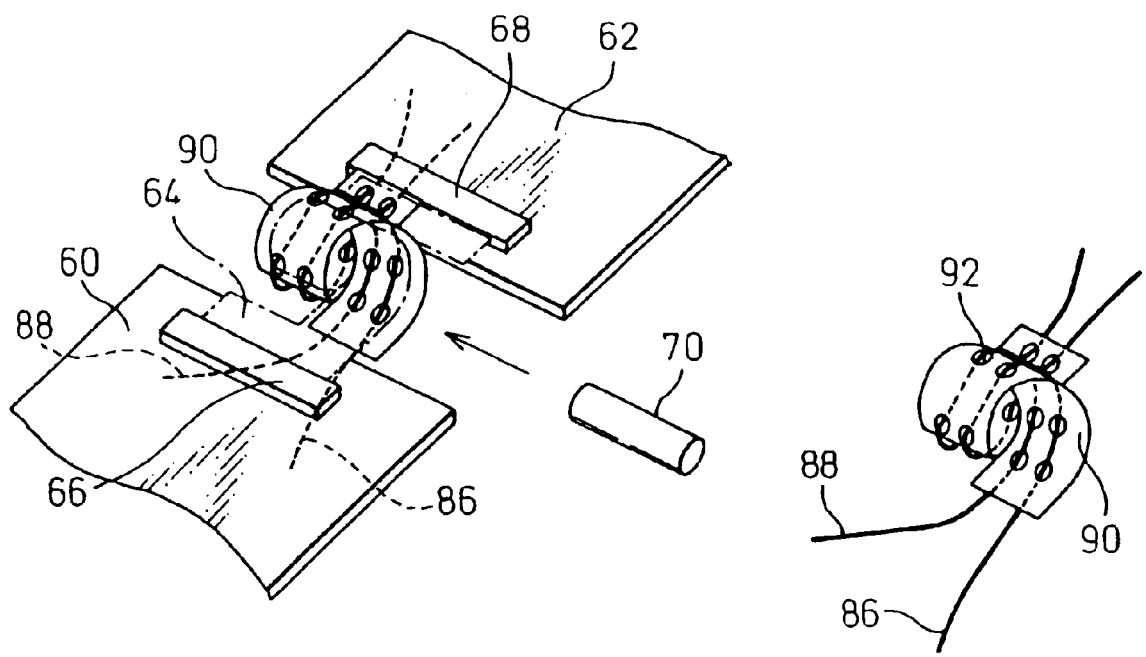
FIGS. 21 and 22 illustrate examples of the wiring of a coaxial cable, respectively, according to the present invention.

FIG. 21 illustrates one example of the wiring of coaxial cables according to the present invention. In the present invention, it is impossible to pass the coaxial cables 86, 88 through a curled portion of a film type printed board 64 since the pin member 70 is inserted into the curled portion. Accordingly, a plurality of holes 92 are provided in a protective sheet 90 for protecting the film type printed board 64, through which pass the coaxial cables 86, 88, whereby it is possible to arrange the coaxial cables 86, 88 almost along the protective sheet 90.

Figure 22:
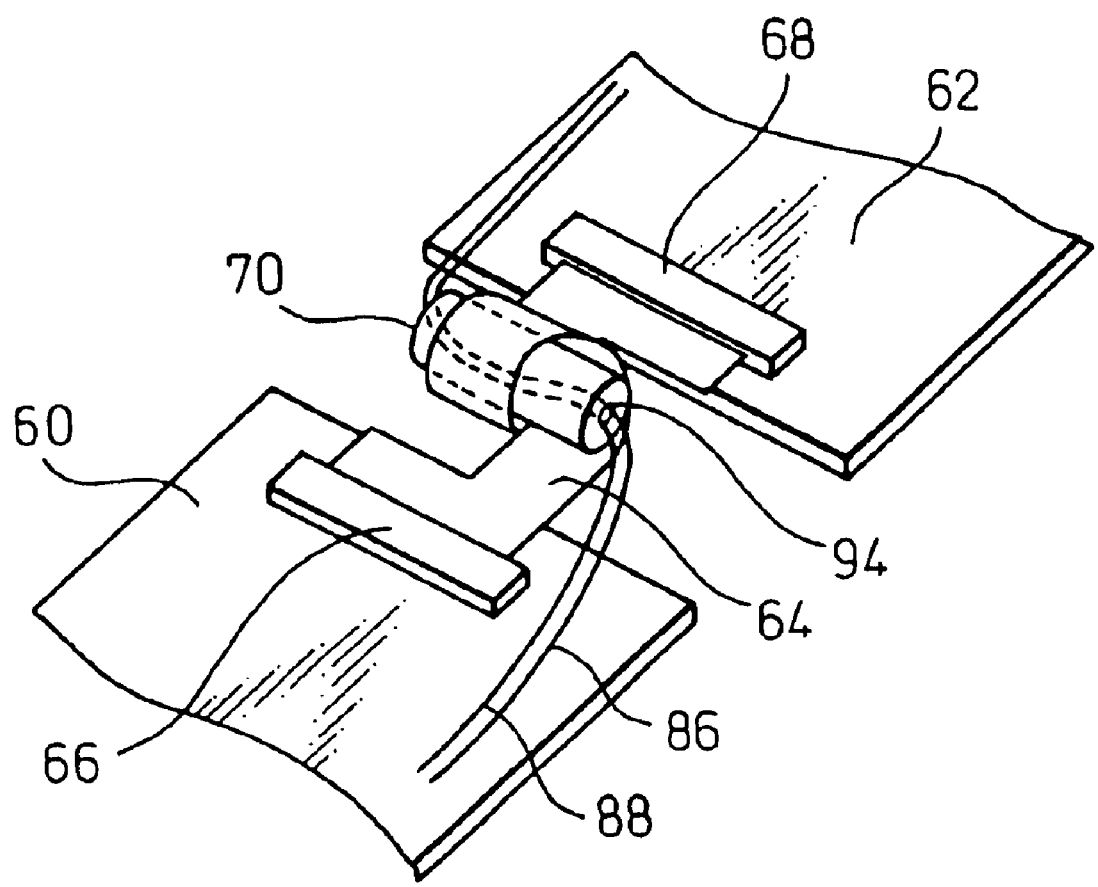

FIG. 22 illustrates another example of the wiring of coaxial cables according to the present invention. In this example, an axial hole 94 is provided along the center line of the pin member 70, through which pass the coaxial cables 86, 88. In this regard, while two coaxial cables are shown in the illustrated example, the coaxial cable may be single or three or more.

While the present invention has been described based on the preferred embodiments of the present invention with reference to the attached drawings, the present invention should not be limited to the above embodiments, but various configurations, modifications or changes may be possible within a spirit or scope of the present invention.

As described hereinabove, according to the present invention, since the pin member is inserted into the curled portion of the flexible printed board (flat cable), a curvature of the curled portion of the flexible cable locally formed therein is prevented from being extremely small even if the opening/closing operation of the movable housing relative to the stationary housing has been frequently repeated. Also, there is no portion of the flexible cable in which a stress is locally concentrated. Thereby, the durability of the flexible cable is improved.

What is claimed is:

1. A portable apparatus, comprising:
   a first housing having a printed board module;
   a second housing coupled at one end thereof with the first housing via a hinge mechanism and having a printed board module;
   a flexible flat cable connected at one end thereof with the printed board module in the first housing and at the other end thereof with the printed board module in the second housing, a portion thereof being curled at a position corresponding to the hinge mechanism;
   a member insertable into the curled portion of the flexible flat cable, wherein the hinge mechanism defines a axis of rotation of the first and second housings and comprises two portions spaced apart from each other in the axial direction, and the curled portion of the flexible flat cable and the insertable member are provided in a space between the two hinge mechanism portions; and
   a limiting mechanism limits the movement of the inserted member, without fixing the inserted member to either the first housing or the second housing.

2. A portable apparatus as defined by claim 1, wherein the limiting mechanism for limiting the movement of the insertable member is a stopper, mainly inhibiting inclination of the insert member relatively to the axis of rotation, attached to either one of the first or second housing.

3. A portable apparatus as defined by claim 1, wherein the flexible cable has two-layered circuit patterns; one of the circuit patterns being connected to one surface of the respective printed board module and the other of the circuit patterns being connected to an opposite surface of the respective printed board module.

4. A portable apparatus as defined by claim 1, wherein a protective sheet is provided on the outer circumference of the flexible flat cable, to protect the flexible flat cable.

5. A portable apparatus as defined by claim 1, wherein the insertable member is made of an elastic material.

6. A portable apparatus as defined by claim 1, wherein the stopper is made of an elastic material.

7. A portable apparatus as defined by claim 1, wherein the insertable member has a hole extending in the axial direction along a corresponding center line thereof, through which at least one cable passes.

* * * * *